(12) United States Patent
Palanchoke

(10) Patent No.: US 12,111,569 B2
(45) Date of Patent: Oct. 8, 2024

(54) METHOD FOR SIZING A GRAY SCALE LITHOGRAPHY MASK

(71) Applicant: COMMISSARIAT A L'ENERGIE ATOMIQUE ET AUX ENERGIES ALTERNATIVES, Paris (FR)

(72) Inventor: Ujwol Palanchoke, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/601,853

(22) Filed: Mar. 11, 2024

(65) Prior Publication Data

US 2024/0302737 A1    Sep. 12, 2024

(30) Foreign Application Priority Data

Mar. 9, 2023 (FR) .................... 2302191

(51) Int. Cl.
*G03F 1/70* (2012.01)

(52) U.S. Cl.
CPC .................... *G03F 1/70* (2013.01)

(58) Field of Classification Search
CPC ....................................................... G03F 1/70
USPC ................................................................ 430/5
See application file for complete search history.

(56) References Cited

U.S. PATENT DOCUMENTS

| | | |
|---|---|---|
| 2004/0009413 A1 | 1/2004 | Lizotte |
| 2005/0118515 A1 | 6/2005 | Progler et al. |
| 2005/0233228 A1 | 10/2005 | Fijol et al. |
| 2012/0148943 A1 | 6/2012 | Farys et al. |
| 2021/0255543 A1 | 8/2021 | Williams et al. |

FOREIGN PATENT DOCUMENTS

| | | |
|---|---|---|
| FR | 2 968 780 A1 | 6/2012 |
| JP | 2001-312044 A | 11/2001 |
| JP | 2001-356471 A | 12/2001 |
| JP | 2003-091070 A | 3/2003 |

OTHER PUBLICATIONS

French Search Report issued in French Patent Application No. 2302191 on Sep. 25, 2023, (w/ English Translation).
Heller et al., "Grayscale Lithography: 3D Structuring and Thickness Control," Proceedings of SPIE 8683, Optical Microlithography XXVI, (Apr. 12, 2013).
Erjawetz et al., "Bend the Curve—Shape Optimization in Laser Grayscale Direct Write Lithography Using a Single Figure of Merit," 15 Micro and Nano Engineering 100137, (2022).
Chevalier et al., "Rigorous Model-Based Mask Data Preparation Algorithm Applied to Grayscale Lithography for the Patterning at the Micrometer Scale," Journal of Microelectromechanical Systems, vol. 30, No. 3. (Jun. 2021).

*Primary Examiner* — Christopher G Young
(74) *Attorney, Agent, or Firm* — Oblon, McClelland, Maier & Neustadt, L.L.P.

(57) ABSTRACT

A method for sizing a greyscale lithography mask is disclosed. The mask includes first opaque zones, being opaque to light-exposing radiation, located in first pixels forming a first mask grating. A first target density of a first surface density of first opaque zones is first established. This first target density makes it possible to expose a resin to light over a first given target thickness when it is exposed to the radiation through the first grating. The dimensions of the first pixels and the dimensions of the first opaque zones are then established, such that the value of an error over the first target thickness is less than a first given threshold. The dimensions obtained for the sizing of the first mask grating are used.

14 Claims, 11 Drawing Sheets

METHOD FOR SIZING A GRAY SCALE LITHOGRAPHY MASK

TECHNICAL FIELD

The present invention relates to the field of photolithography, more specifically that of greyscale lithography. The invention quite specifically relates to the optimisation of the mask used in this technique.

STATE OF THE ART

Greyscale lithography is a photolithography technique, enabling the production of three-dimensional (3D) microstructures in one single lithography and development step. It is particularly used in manufacturing optical microelements, MEMS (microelectromechanical systems), MOEMS (microoptoelectromechanical systems), microfluid devices or also textured surfaces.

This technique is based on the fact of making the thickness vary along a dimension Z on which a photosensitive resin is exposed to light by modulating in the space, the ultraviolet (UV) dose received by the resin. Once the portions exposed to light are developed, the resin has a 3D structuring (seen in the scanning electron microscope (SEM) represented in FIGS. 1B and 1D) and can, for example, serves a mould for manufacturing 3D microstructures.

The ultraviolet dose received locally by the resin can, in particular be modulated by playing on the dimensions and the positioning of opaque zones present on the lithography mask (FIGS. 1A and 1C). These opaque zones are typically made by depositing chromium on a glass mask.

Greyscale lithography thus makes it possible to obtain 3D microstructures having a characteristic height going from ten to a few hundred micrometres. However, the height at each point of the microstructure is highly dependent on manufacturing errors at the mask. Documents US 2005/233228 A1, FR 2 968 780 A1, US 2021/255543 A1, US 2005/118515 A1 disclose methods for manufacturing greyscale lithography masks, but do not make it possible to obtain, at microstructures manufactured using these masks, an optimal Z resolution.

There is therefore a need to minimize the error over the thickness exposed to light of the photosensitive resin, in order to improve the Z resolution of the 3D microstructures manufactured by greyscale lithography.

SUMMARY

To achieve this aim, according to a first aspect of the invention, relates to a method for sizing a greyscale lithography mask, the mask mainly extending along a horizontal plane defined by a first direction and a second direction, the plane being perpendicular to a main direction of a light-exposing radiation of a photosensitive resin through the mask. The mask comprises a plurality of radiating opaque zones, each opaque zone being located in a zone of the so-called pixel mask, the plurality of opaque zones comprising first opaque zones being located in first pixels, the first pixels forming a first mask grating. The method comprises the following steps:

a. Establishing a first target density $D_{100}^*$ of a first surface density $D_{100}$ of first opaque zones within the first grating, the first target density $D_{100}^*$ being configured to enable the resin to be exposed to light over a first given target thickness $e_1^*$ when the resin is exposed to radiation through the first mask grating, the first target thickness $e_1^*$ being measured in the main direction of the radiation, b. Obtaining a first value, for the first target density $D_{100}^*$, of the derivative with respect to the first surface density $D_{100}$ of the first thickness $e_1$ over which the photosensitive resin is exposed to light, when it is exposed to a radiation through the first grating having the first surface density $D_{100}$, said first value being referenced $$\frac{\partial e_1(D_{100}^*)}{\partial D_{100}},$$

c. Determining a first dimension $P_{x,1}$ of the first pixels in the first direction, a first dimension $P_{y,1}$ of the first pixels in the second direction, a first dimension $L_{x,1}$ of the first opaque zones in the first direction, a first dimension $L_{y,1}$ of the first opaque zones in the second direction, such that the value of an error over the first target thickness $e_1^*$, referenced MEEF($e_1^*$), is less than a first given threshold, MEEF($e_1^*$) being calculated from the following formula:

$$MEEF(e_1^*) = \frac{\partial e_1(D_{100}^*)}{\partial D_{100}} \frac{(a_1 + \beta_1)L_{x,1}}{P_{x,1}P_{y,1}}$$

With $$\beta_1 = \frac{L_{y,1}}{L_{x,1}} \text{ and } a_1 = \frac{\delta L_{y,1}}{\delta L_{x,1}}, \delta L_{x,1}$$

being an error over $L_{x,1}$ and $\delta L_{y,1}$ being an error over $L_{y,1}$, d. Using the dimensions obtained for the sizing of the first mask grating.

These different steps make it possible to optimise the sizing of the pixels and of the opaque zones in the horizontal plane, in order to limit the error over the target thickness. Indeed, the current sizing methods only restrict the choice of the opaque zone density. Once this density D is fixed, without other constraint, an infinity of sizings of the pixels and of the opaque zones is possible. For example, in the particular case of square pixels of side P and of square opaque zones of side L, any pair (L,P) satisfying $L^2/P^2 = D$ could be suitable. However, all these pairs do not lead to a satisfactory resolution in the main radiation direction, at the formed 3D structure.

The method according to the invention therefore makes it possible to determine dimensions of pixels and of opaque zones leading to a satisfactory error level.

The method thus makes it possible to obtain a significant improvement of the quality of the 3D structures produced by greyscale lithography.

A second aspect of the invention relates to a method for manufacturing a greyscale lithography mask comprising the following steps:

a. Sizing the mask by implementation of the method according to the first aspect, b. Manufacturing the mask thus sized.

BRIEF DESCRIPTION OF THE FIGURES

The aims, objectives, as well as the features and advantages of the invention will emerge best from the detailed description of an embodiment of the latter, which is illustrated by the following accompanying drawings, wherein:

FIGS. 1A and 1B relate to the manufacture of 3D structures having plates at different heights.

FIGS. 1C and 1D relate to the manufacture of 3D microlenses having a dome shape.

Figure 1A:
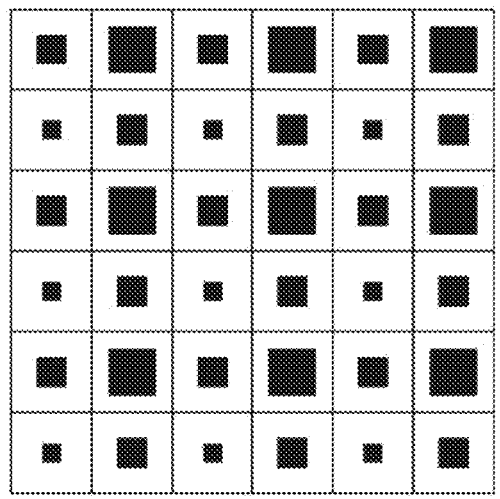
FIGS. 1A to 1D represent greyscale lithography masks and scanning electron microscope views of resins exposed to light through these masks, then developed.
Figure 1A:
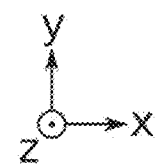
Figure 1B:
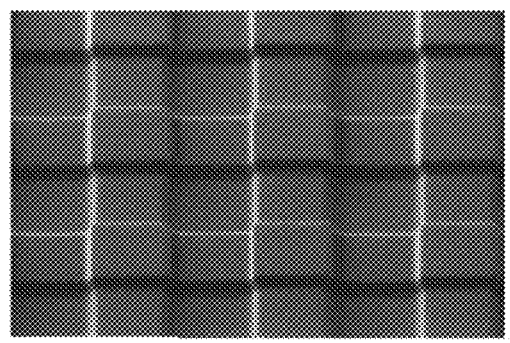
Figure 1C:
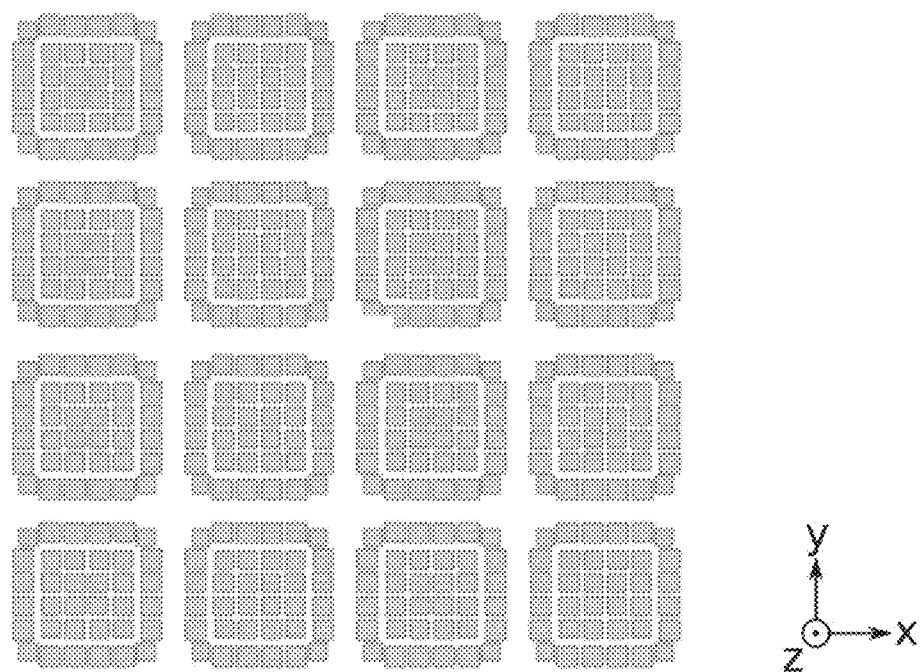
Figure 1D:
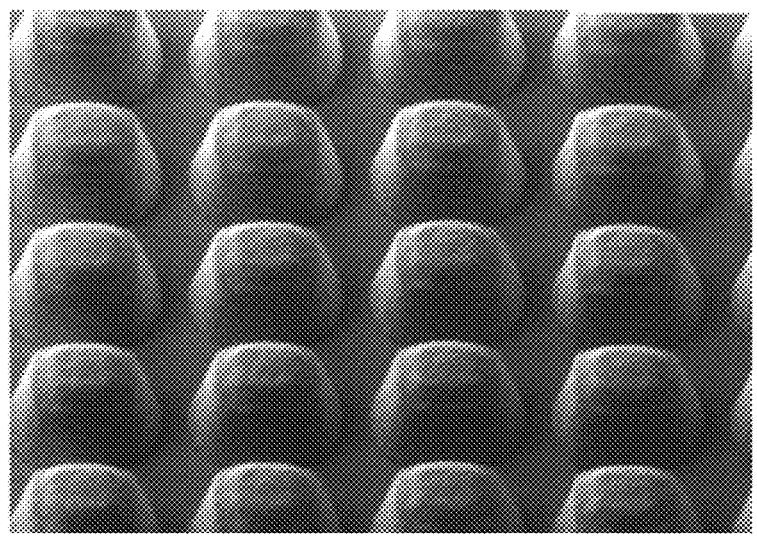

The drawings are given as examples and are not limiting of the invention. They constitute principle schematic representations intended to facilitate the understanding of the invention and are not necessarily to the scale of practical applications. In particular, the dimensions are not representative of reality.

DETAILED DESCRIPTION

Before starting a detailed review of embodiments of the invention, optional features are stated below, which can optionally be used in association or alternatively:

According to an advantageous embodiment, a is between 0.8 and 1.2, preferably a is equal to 1.

According to an example, the step of obtaining the first value of the derivative comprises the following steps:

a. Providing a secondary resin of the same nature as the photosensitive resin, b. Exposing a plurality of regions of the secondary resin to light with a radiation, each region being exposed to light with a distinct dose of radiation, c. For each region of the secondary resin, determining in the main direction of the radiation, a light-exposing thickness of the radiation in said region, d. Establishing, for each region of the secondary resin, a theoretical density of theoretical opaque zones on a theoretical mask, which, during exposure to a radiation of said region through the theoretical mask, would have made it possible to expose said region to the dose of radiation, to which said region is exposed, e. Establishing a model connecting the light-exposing thickness of the secondary resin layer to the opaque zone density from light-exposing thickness and theoretical density data obtained for each of the regions.

According to an example, the step of establishing, for each region of the secondary resin, the theoretical density of theoretical opaque zones, is done at least by application of the following formula:

$$D_i = 1 - \frac{Q_i}{Q_{max}}$$

with i indexing the different regions of the secondary resin, $D_i$ the theoretical density associated with the region i, $Q_i$ the dose of radiation to which the region i is exposed and $Q_{max}=\max(Q_i)$.

According to an example, the step of obtaining the first value of the derivative comprises the following steps:

a. Providing a test mask having a plurality of test gratings, each having a distinct density of test opaque zones, b. Providing a test resin of the same nature as the photosensitive resin, c. Exposing a plurality of regions of the test resin to light with a radiation through the test mask, the exposing to light of each region being done through a distinct test grating, d. Determining, for each region of the test resin, a light-exposing thickness of the radiation in said region, e. Establishing a model connecting the light-exposing thickness of the test resin layer to the density of test opaque zones from light-exposing thickness data obtained for each of the regions.

Advantageously, the first dimension $P_{x,1}$ of the first pixels in the first direction and the first dimension $P_{y,1}$ of the first pixels in the second direction are each less than a main wavelength of the radiation.

Preferably, the first pixels have a square shape in the horizontal plane, and wherein $P_{x,1}=P_{y,1}=P$.

Preferably, the first opaque zones have a square shape in the horizontal plane, and wherein $L_{x,1}=L_{y,1}=L$.

According to an example, $$MEEF(e_1^*) = \frac{\partial e_1(D_{100}^*)}{\partial D_{100}} \frac{2\sqrt{D_{100}^*}}{P}.$$

According to a preferred embodiment, the plurality of opaque zones comprises at least second opaque zones being located in second pixels, the second pixels forming a second mask grating, the method further comprising the following steps:

a. Establishing a second target density $D_{200}^*$ of a second surface density $D_{200}$ of second opaque zones within the second grating, the second target density $D_{200}^*$ being configured to enable the resin to be exposed to light over a second given target thickness $e_2^*$ when the resin is exposed to the radiation through the second mask grating, the second target thickness $e_2^*$ being measured in the main direction of the radiation, the second target thickness $e_2^*$ being distinct from the first target thickness $e_1^*$, b. Obtaining a second value, for the second target density $D_{200}^*$, of the derivative with respect to the second surface density $D_{200}$ of the second thickness $e_2$ over which the photosensitive resin is exposed to light when it is exposed to a radiation through the second grating (200) having the second surface density $D_{200}$, referenced $$\frac{\partial e_2(D_{200}^*)}{\partial D_{200}},$$

c. Determining a second dimension $P_{x,2}$ of the second pixels in the first direction, a second dimension $P_{y,2}$ of the second pixels in the second direction, a second dimension $L_{x,2}$ of the second opaque zones in the first direction, a second dimension $L_{y,2}$ of the second opaque zones in the second direction, such that the value of an error over the second target thickness $e_2^*$, referenced $MEEF(e_2^*)$ is less than a second given threshold, $MEEF(e_2^*)$ being calculated from the following formula:

$$MEEF(e_2^*) = \frac{\partial e_2(D_{200}^*)}{\partial D_{200}} \frac{(a_2 + \beta_2)L_{x,2}}{P_{x,2}P_{y,2}}$$

With $$\beta_2 = \frac{L_{y,2}}{L_{x,2}} \text{ and } a_2 = \frac{\delta L_{y,2}}{\delta L_{x,2}}, \delta L_{x,2}$$

being an error over $L_{x,2}$ and $\delta L_{y,2}$ being an error over $L_{y,2}$, d. Using the dimensions obtained for the sizing of the second mask grating.

According to an advantageous example, the second grating forms, in the horizontal plane, a closed contour, wherein the first grating is located.

According to a preferred example, the closed contour formed by the second grating is substantially circular. This example is particularly advantageous in the manufacture of microlenses.

According to an example, the second threshold for the error over the second target thickness $e_2^*$ is less than the first threshold for the error over the first target thickness $e_1$.

In the scope of the present invention, resin is qualified as an organic or organo-mineral material being able to be shaped by an exposure to an electron beam, photon beam, X-ray beam, a light beam in the ultraviolet, extreme ultraviolet (EUV) or deep ultraviolet (Deep UV) range, typically in the range of wavelengths of 193 nm to 248 nm, the emission rays of a mercury lamp, that is: 365 nm for the I line, 435 nm for the G line and 404 nm for the H line.

The invention also applies to positive resins, i.e. the exposed part of which becomes soluble to the developer, and where the unexposed part remains insoluble, that to negative resins, i.e. the unexposed part of which becomes soluble to the developer, and where the exposed part remains insoluble.

$$\frac{e}{e_0} = \gamma \ln\left(\frac{D_0}{D}\right)$$

The contrast or a resin, commonly referenced y, conveys the effectiveness of the performance mentioned in literature as "at the threshold" of the resin. The greater the contrast is, the more a low dose variation is necessary, such that the resin passes from a state wherein it cannot be developed, to a state wherein it can be developed (or conversely, for a negative resin). The value of the contrast y of a resin, whether it is positive or negative tonality, is generally determined by the slope of the curve according to the following equation:

$$\frac{e}{e_0} = \gamma \ln\left(\frac{D_0}{D}\right),$$

where e is the thickness of the resin film after exposure and development, $e_0$ is the thickness of the initial resin film, D is the dose of exposure applied and $D_0$ is the dose at which the entire thickness of the film is developed.

By "nature" of a material such as a resin, this means its chemical composition, i.e. the nature and the proportion of the species constituting the material. Two layers are considered as made of one same resin, if they have the same chemical composition.

In the present description, a quantity of energy received by a resin per surface unit is qualified as a dose. This energy can be in the form of photons (photolithography) for a photosensitive resin. It is thus the product of the intensity of the incident light radiation (generally expressed in Watt/m$^2$) and of the duration of exposure (expressed in seconds). The dose is thus usually expressed in Joules per m$^2$, or more often in milliJoules (mJ) per cm$^{-2}$ ($10^{-4}$ m$^2$) or also in mJ/m$^2$. This energy can also be in the form of electrons (electron lithography) for an electrosensitive resin. The dose is thus usually expressed in Coulombs per m$^2$, or more often in microCoulombs ($\mu$C) per cm$^{-2}$ ($10^{-2}$ m$^2$), that is in $\mu$C/m$^2$.

By a parameter "substantially equal to/greater than/less than" a given value, this means that this parameter is equal to/greater than/less than the given value, plus or minus 20%, even 10%, of this value. By a parameter "substantially between" two given values, this means that this parameter is, as a minimum, equal to the smallest given value, plus or minus 20%, even 10%, of this value, and as a maximum, equal to the greatest given value, plus or minus 20%, even 10%, of this value.

In the present patent application, preferably thickness will be referred to for a layer, and height will be referred to for a structure or a device. The thickness is taken in a direction normal to the main extension plane of the layer, and the height is taken perpendicularly to the horizontal plane XY. Thus, a layer typically has a thickness in the so-called vertical direction Z, when it extends mainly along the horizontal plane XY. The relative terms "on", "under", "underlying" refer preferably to position taken in the vertical direction Z. A first aim of the present invention relates to a method of sizing a greyscale lithography mask 1. The mask 1 sized using the method according to the invention can be called "optimised mask" or "resized mask".

Figure 2A:
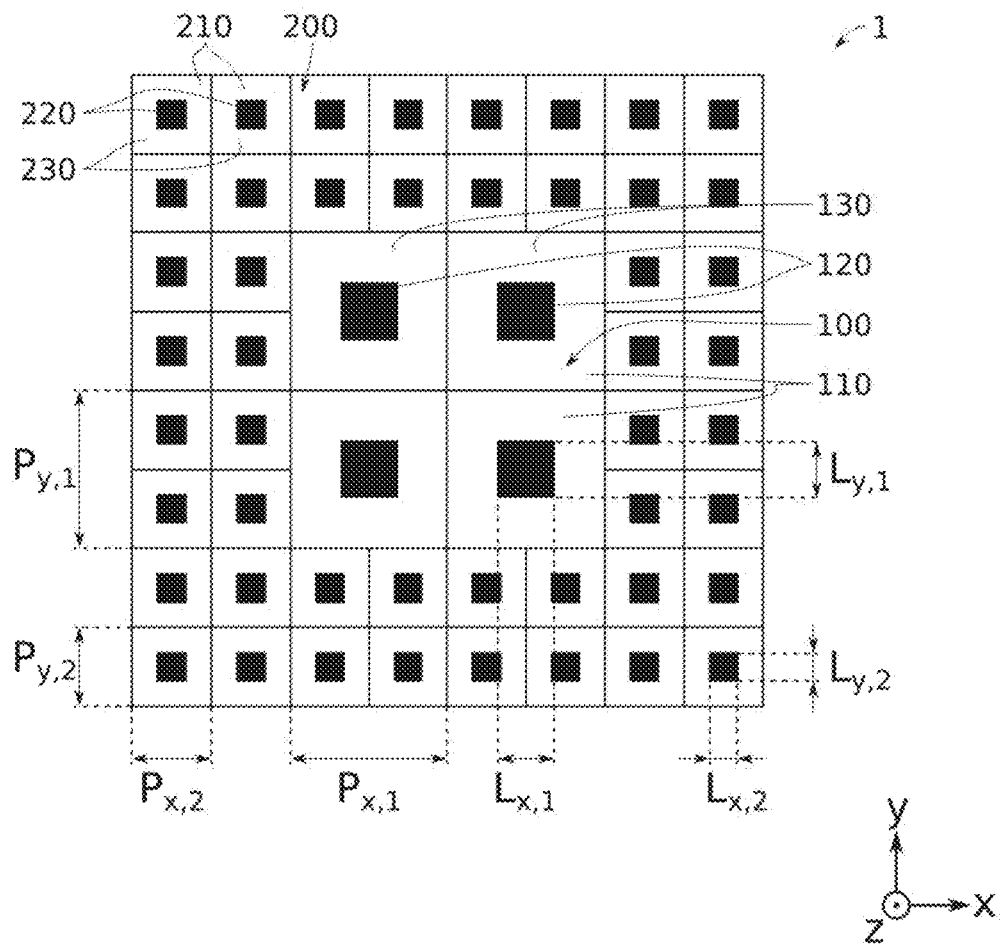
FIG. 2A represents a greyscale lithography mask.
Figure 2B:
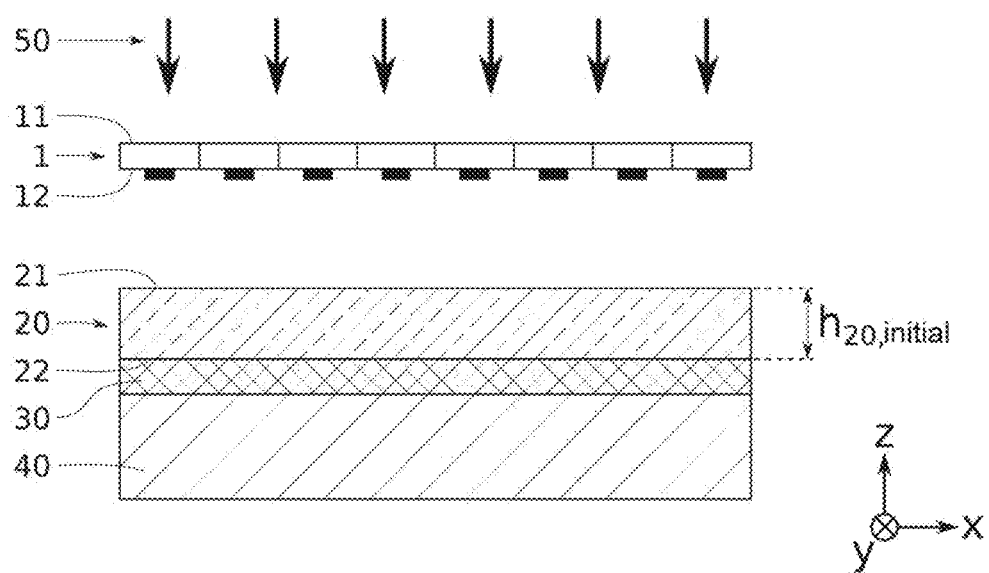
FIG. 2B is a cross-sectional view of a greyscale lithography mask in the process of being used for exposing a photosensitive resin to light.

The mask 1 is represented in FIGS. 2A and 2B. It extends mainly along a plane (in the horizontal example) XY defined by the first direction X and the second direction Y. More specifically, it has an upper face 11 and a lower face 12, each extending substantially parallel to the horizontal plane XY.

During the use of the mask 1, its lower face 12 is placed facing an upper face 21 of a resin layer 20, which can also be called resin 20. The upper face 21 of the resin layer 20 itself also extends parallel to the horizontal plane XY. The resin layer 20 typically rests on a support substrate 40. A sublayer 30 can be inserted between the support substrate 40 and the resin layer 20.

During the use of the mask 1, the resin layer 20 is exposed to a radiation 50 through the mask 1. This radiation 50 has a main direction, substantially perpendicular to the horizontal plane XY. The radiation 50 is typically a UV (ultraviolet) radiation; this can thus be a radiation emitting into a wavelength range going from around 100 nm to around 400 nm, for example, 365 nm. This can, however, also be a radiation having wavelengths being located outside of this range. Generally, a radiation emitting into a wavelength range going from around 90 nm to around 500 nm can be considered, in a non-limiting manner.

Ideally, the resin 20 used has at least one of the following features:
 a. A substantially linear response between the dose of radiation to which it is exposed and the thickness over which it is exposed to light.
 b. A sufficiently low contrast, for example, less than 2, to enable the implementation of the greyscale lithography, but sufficiently high, for example, greater than 1, to avoid too high exposure times. Advantageously, the contrast is between 1.1 and 1.5.
 c. Good filmogenic properties, guaranteed for example, by the presence of a filmogenic agent in its composition.
 d. A low inhibition of the dissolution.

Resins, produced by the company Micro Resist Technology having the commercial references P 1215G, ma-P 1225G and ma-P 1275G can, in particular, be mentioned as resins which can be used in the context of the invention.

The following paragraphs aim to describe, more specifically, the mask 1 in reference to FIG. 2A.

As is commonly done during the design of a lithography mask, the mask 1 is divided into a plurality of pixels, sometimes called cells. These pixels or cells serve as markers in the horizontal plane XY and have no physical reality, other than a zone of the mask including one, and only one, opaque zone. Each pixels defines a theoretical closed contour in the horizontal plane XY, wherein an opaque zone and a transparent zone are located. The opaque zones and the transparent zones have, themselves, a physical reality. The transparent zones correspond to regions of the mask 1, the composition of which is transparent to the radiation 50, while the opaque zones correspond to regions of the mask 1, the composition of which is opaque to the radiation 50. A zone is, for example, considered as opaque when it stops at least 90% of the incident radiation 50. A zone is considered as transparent, when it transmits at least 60% of the incident radiation 50.

For example, the mask 1 can be a glass mask with chromium depositions. The opaque zones thus correspond to the zones of the mask 1 where the chromium has been deposited, while the transparent zones correspond to the zones which remain chromium-free.

According to the principle of greyscale lithography, for a given region of the mask 1, the surface density D of the opaque zones within this region determines the dose of radiation received by the region of the underlying resin layer 20 and therefore, consequently, the thickness e over which this region of the resin layer 20 is exposed to light by the radiation 50. This density D is typically modulated from one region to the other of the mask, so as to spatially modulate the thickness exposed to light in the resin layer 20.

For a given region of the mask 1, the surface density D of the opaque zones is the ratio between the surface of the region occupied by the opaque zones and the total surface of the region. These surfaces can, for example, be evaluated at the lower face 12 of the mask 1, on which the depositions of material (for example, chromium) are typically done, forming the opaque zones.

FIG. 2A illustrates the case of pixels disposed in square gratings, but it can be considered that the latter are of another type. This can, for example, be grating shapes, from among a triangular grating or a hexagonal grating.

FIG. 2A moreover illustrates the case of square-shaped opaque zones in the horizontal plane XY, but it is understood that other shapes can be considered. The opaque zones can, for example, be rectangular, circular, triangular or also hexagonal.

The type of grating according to which the pixels are arranged and the shape of the opaque zones are chosen so as to obtain the desired density within each region of the mask 1.

As illustrated in FIG. 2A, the opaque zones comprise a plurality of first opaque zones 120 and the transparent zones comprise a plurality of first transparent zones 130. The position of these first opaque zones 120 and of these first transparent zones 130 is marked by first pixels 110. The first pixels 110 together form a first grating 100 of the mask 1. This first grating 100 corresponds to a region of the mask 1, such as described above. The first grating 100 typically comprises more than four first pixels 110.

The grating 100 is preferably contiguous. In other words, preferably, all the pixels 110 of the grating 100 are located contiguously. The grating 100 can optionally have, projecting a hollow shape into the horizontal plane XY.

Each first pixel 110 defines a closed contour, wherein a first opaque zone 120 and a first transparent zone 130 are located.

Within the first grating 100, the first pixels 110 all have the same shape and the same dimensions. In the first direction X, the first pixels 110 have a first dimension $P_{x,1}$ and the first opaque zones 120 have a first dimension $L_{x,1}$. In the second direction Y, the first pixels 110 have a second dimension $P_{y,1}$ and the first opaque zones 120 have a second dimension $L_{y,1}$. Moreover, within the first grating 100, the first opaque zones 120 are all located at one same position relative to the pixel 110 which surrounds them. Preferably, the first opaque zones 120 are centred in the pixels 110.

The mask 1 advantageously has a second grating 200 of second pixels 210 each comprising a second opaque zone 220 and a second transparent zone 230. Within the second grating 200, the second pixels 210 all have the same shape and the same dimensions. In the first direction X, the second pixels 210 have a first dimension $P_{x,2}$ and the second opaque zones 220 have a first dimension $L_{x,2}$. In the second direction Y, the second pixels 210 have a second dimension $P_{y,2}$ and the second opaque zones 220 have a second dimension $L_{y,2}$.

The relative positions of the first grating 100 and of the second grating depend on the shape of the 3D structure which is sought to be manufactured. According to an embodiment having numerous applications, the second grating 200 forms a closed contour in the horizontal plane XY and the first grating 100 is contained in this closed contour. Advantageously, this closed contour has a substantially circular shape. For example, the second grating 200 can have, in the horizontal plane XY, the shape of a circular crown and the first grating 100, has the shape of a disc, the first grating 100 and the second grating 200 preferably being concentric. The latter case in particular makes it possible to form a microlens. Preferably, more than two gratings are used to form a microlens.

It must be noted that the pixels typically have straight edges, it is impossible that the gratings have perfectly curved, and in particular, perfectly circular shapes. The shapes described for the gratings of the mask therefore mean general shapes, the pixelisation of which must be overlooked.

It is understood that the mask 1 can have as many pixel gratings and opaque zones as the targeted applications require. All the features described for the first grating apply mutatis mutandis to the second grating and to any other additional grating. What will distinguish one grating from another, will typically be the opaque zone density within it and therefore, the resin thickness which will be exposed to light when the latter will be exposed to a radiation through the grating. In other words, the different gratings of the mask 1 will typically make it possible to form regions of different heights within the 3D structure made in the resin 20. It is not however excluded, that two gratings have the same opaque zone density, and therefore makes it possible to form regions of the same height in the resin 20. Gratings having the same opaque zone density can be juxtaposed or not, according to the 3D structures to form.

As stated in the introduction, an aim of the invention is to propose a solution to improve the resolution in the vertical direction Z of the formed 3D structures. The following paragraphs first aim to show how the error over the thickness of resin exposed to light (or the height of the resin after development) is established, measured in the vertical direction Z, from the dimensions in the horizontal plane XY of the pixels and of the opaque zones.

In the generic case of a mask 1 comprising N opaque zones of dimensions $L_{x,i}$, $L_{y,i}$ (i varying from 1 to N), each opaque zone being located within a pixel of dimensions $P_x$, $P_y$, the theoretical density ($D_{mask,\ theoretical}$) of opaque zones within the mask is given by the following formula:

$$D_{mask,theoretical} = \frac{\sum_{i=1}^{N} L_{x,i} L_{y,i}}{NP_x P_y} \qquad [\text{Math 1}]$$

This formula does not consider potential errors in manufacturing the mask 1. Such errors can indeed have the consequence of variations on the dimensions of the opaque zones with respect to the targeted values. However, the pixels having no physical reality, it is reasonable to consider that they cannot form the subject of manufacturing errors. By referencing $\delta L_{x,i}$ and $\delta L_{y,i}$ the errors on the first dimension $L_{x,i}$ and the second dimension $L_{y,i}$ respectively of the opaque zones, the actual opaque zone density within the mask is given by the following formula:

$$D_{mask,actual} = \frac{\sum_{i=1}^{N} (L_{x,i} + \delta L_{x,i})(L_{y,i} + \delta L_{y,i})}{NP_x P_y} \qquad [\text{Math 2}]$$

Moreover, it is common to estimate that the error $\delta L_{x,i}$ on the dimension $L_{x,i}$ along X of the opaque zones and the error $\delta L_{y,i}$ on the dimension $L_{y,i}$ along Y of the opaque zones are proportional:

$$\delta L_{y,i} = a_i \delta L_{x,i} \qquad [\text{Math 3}]$$

By making this hypothesis, the Math 2 equation can be rewritten as follows:

$$D_{mask,actual} = D_{mask,theoretical} + \frac{\sum_{i=1}^{N} \delta L_{x,i}(a_i L_{x,i} + L_{y,i})}{NP_x P_y} \qquad [\text{Math 4}]$$

Thus, the error of the opaque zone density within the mask 1 can be calculated as follows, by considering that the error $\delta L_{x,i}$ on the first dimension $L_{x,i}$ of the opaque zones is the same for all the opaque zones:

$$\delta D_{mask} = D_{mask,theoretical} - D_{mask,actual} = \delta L_x \frac{\sum_{i=1}^{N}(a_i L_{x,i} + L_{y,i})}{NP_x P_y} \qquad [\text{Math 5}]$$

In the case of opaque zones all having the same dimensions ($L_{x,i}=L_x$ et $L_{y,i}=L_y$ for any i, and therefore $a_i$=a for any i), it is possible to establish a proportionality link between their dimension in the first direction and their dimension in the second direction:

$$L_y = \beta L_x \qquad [\text{Math 6}]$$

In this case, the error $MEEF_z$ in the vertical direction Z over the resin height h remaining after development is given by the following formula:

$$MEEF_Z = \frac{\partial h}{\partial D_{mask}} \frac{(a+\beta)L_x}{P_x P_y} \qquad [\text{Math 7}]$$

If it is considered that the pixels all have, in the plane XY, the shape of a square of side P ($P_x=P_y=P$) and that the opaque zones all have, in the plane XY, the shape of a square of side L ($L_x=L_y=L$), then the error $MEEF_z$ in the vertical direction Z over the resin height h remaining after development is given by the following formula:

$$MEEF_Z = \frac{\partial h}{\partial D_{mask}} \frac{(a+1)\sqrt{D_{mask,theoretical}}}{P} \qquad [\text{Math 8}]$$

As thus, $\beta=1$.

The Math 8 formula shows that it is possible to modulate the error $MEEF_z$ by making the dimensions of the pixels of the grating vary.

Moreover, by assuming that a=1 (i.e. that the error $\delta L_{x,i}$ on the first dimension $L_{x,i}$ of the opaque zones and the error $\delta L_{y,i}$ on the second dimension $L_{y,i}$ of the opaque zones are equal), the Math 8 formula can be simplified further:

$$MEEF_Z = \frac{\partial h}{\partial D_{mask}} \frac{2\sqrt{D_{mask,theoretical}}}{P} \qquad [\text{Math 9}]$$

It must be noted that to characterize the impact of the light exposure on the resin, two complementary dimensions can be considered, both measured in the vertical directions Z:
 a. The thickness e over which the resin is exposed to light, before development,
 b. The height h of the resin remaining after development of the portion exposed to light.
 e and h are very directly linked by the relationship $h=h_{20,initial}-e$, with $h_{20,initial}$ the height of the resin 20 before the development step. Thus, "determining e" can pass through measuring h, and vice versa. Moreover, given the existing relationship between h and e, the error over e is substantially equal to the error over h. $MEEF_z$, MEEF(h) or MEEF(e) will this equally be noted.

Figure 5:
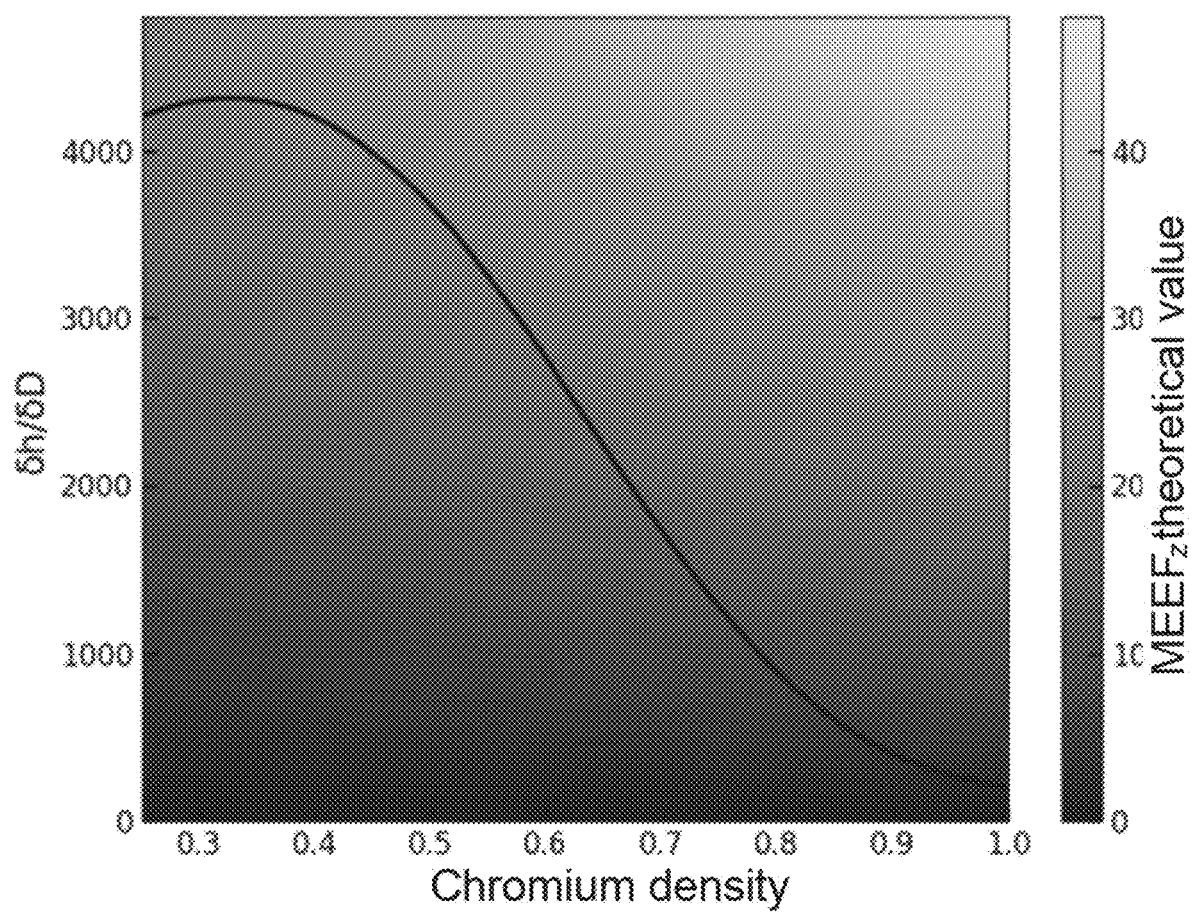
FIG. 5 is a graph illustrating the evolution of the error over the height of the remaining resin after exposure according to the opaque zone density and of the slope of the contrast curve for fixed pixel dimensions.

FIG. 5 illustrates the evolution of the value of $MEEF_z$ according to the parameter $\delta h/\delta D_{mask}$ and to the opaque zone density at the mask, and this, for fixed pixel dimensions. The traced curve corresponds to the values of $MEEF_z$ obtained for a given structure. It is observed that $MEEF_z$ increases when the opaque zone density decreases. It is therefore quite specifically crucial to find a solution to reduce $MEEF_z$ being able to apply for low density values.

Figure 6:
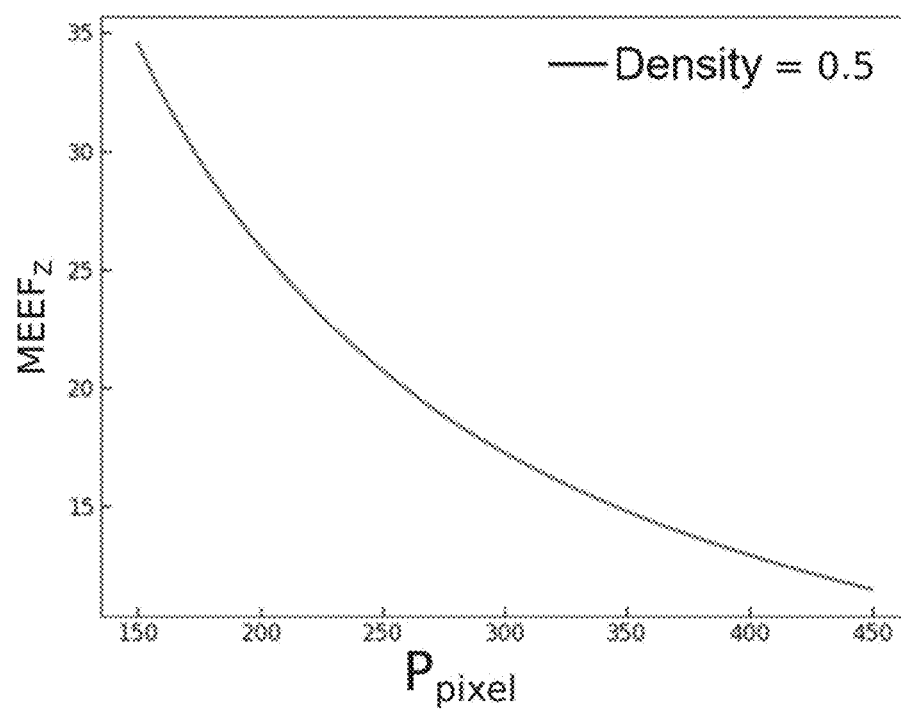
FIG. 6 is a graph illustrating the evolution of the error over the height of the remaining resin after exposure according to the pixel dimensions, at fixed opaque zone density.

FIG. 6 illustrates the evolution of the value of $MEEF_z$ according to the length of the side of the pixels (in this case, the pixels are square), and this, for a fixed opaque zone density. It is observed that the larger the side of the pixels is, the lower $MEEF_z$ is. It is therefore deduced that, to improve the resolution in Z of the 3D structures, increasing the dimensions of the pixels is an effective solution. This solution appears all the more interesting, that it is applicable for any density value, and in particular, for low density values, which is particularly problematic (see FIG. 5).

Thus, a minimum threshold is typically defined for $MEEF_z$, corresponding to a minimum dimension of the pixels, in order to guarantee a good resolution in the vertical direction Z. It is noted that a too high increase of the dimensions of the pixels can cause a decrease of the resolution in the horizontal plane XY beyond acceptable levels. Thus, a maximum threshold for $MEEF_z$ can be used complementarily to the minimum threshold to satisfy a satisfactory resolution in the first direction X and a satisfactory resolution in the second direction Y.

However, if a dimension of the opaque zones (in the first direction X or the second direction Y) is greater than or equal to the main wavelength of the radiation 50, then the opaque zones risk being resolved and their shape risks being transferred to the 3D structure formed by greyscale lithography using the mask 1. Thus, advantageously, $P_x$ and $P_y$ (P in the case of square pixels) are less than the main wavelength of the radiation 50. The maximum threshold for $MEEF_z$ can correspond to a value guaranteeing this.

In the case of a monochromatic radiation, the main wavelength means the only wavelength represented. In the case of a polychromatic radiation covering a wavelength interval, the main wavelength can be the wavelength located in the middle of this interval.

Method for Developing an Abacus Linking Opaque Zone Density and Thickness Exposed to Light Using a Test Mask The paragraphs below present a first method by which it is possible to obtain an abacus linking density of opaque zone and thickness exposed to light in the resin (or height of the resin after development). This method is favoured when a so-called "test mask" lithography mask is disposed, being able to be used to carry out tests in view of the optimised sizing of the mask, thanks to the method according to the invention. It is understood that any other method can be implemented to obtain the same data.

Figure 3:
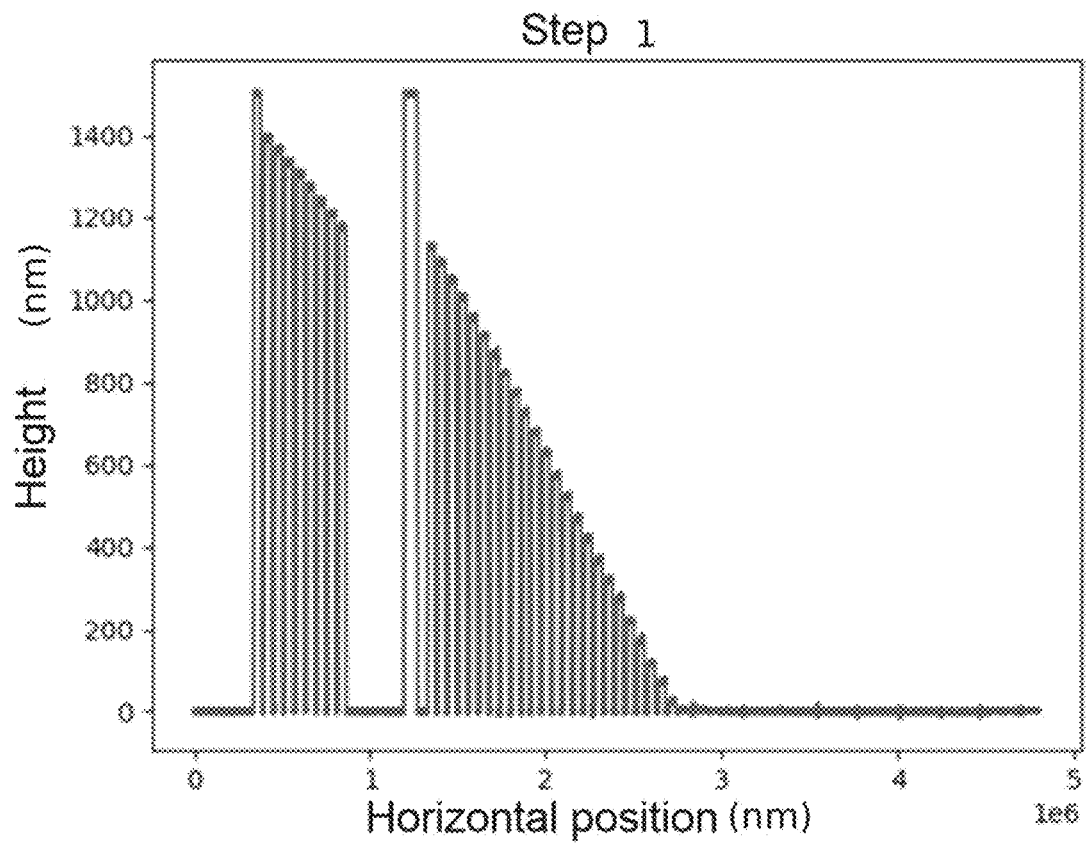
FIG. 3 illustrates the profile of a resin layer exposed in different regions to light radiations passed through masks or regions of one same mask having different densities of opaque zones.
Figure 4:
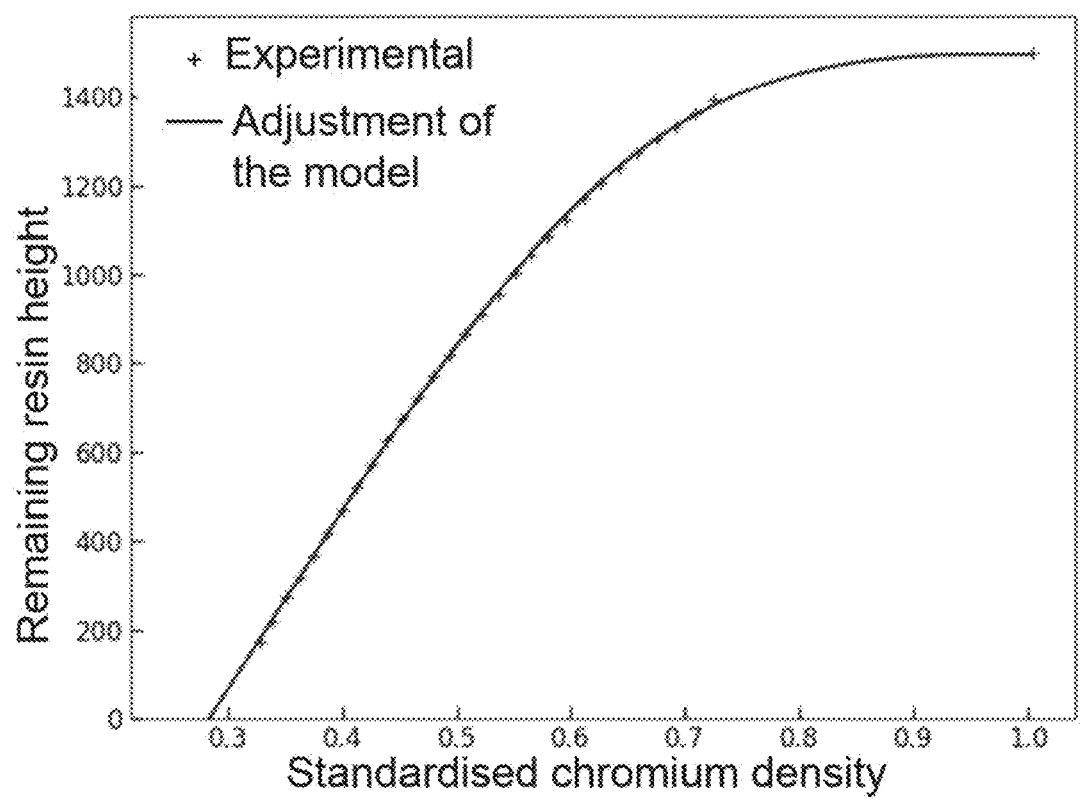
FIG. 4 is a graph illustrating the evolution of the height of the remaining resin after exposure to a radiation through the lithography mask then development, according to the opaque zone density at said lithography mask.

The different steps of this method are illustrated in FIGS. 3 and 4.

First, a test mask having several distinct gratings, called test gratings, is used to expose to light, a test resin layer of the same nature as that which will be used in association with the optimised mask (resin layer 20). The different gratings of the mask each have a different opaque zone density. After development, the resin height obtained for each opaque zone density is measured. The experimental results obtained are illustrated in FIG. 3.

Then, from the experimental points obtained thanks to the test mask, a trend curve is established, connecting the opaque zone density D to a theoretical mask and the resin height h after development when the resin has been exposed to light through this mask. The experimental points coming from the preceding step, as well as the model established from these points are represented on the graph of FIG. 4. This trend curve, which corresponds to a contrast curve, is continuous and makes it possible to estimate the relationship between h and D for the density values not being present on the test mask.

The derivative of the function corresponding to this trend curve conveys the impact of a variation of the opaque zone density over the height of the resin after development. This value comes into play in determining the error over the height of the resin after development (see Math 7 formula).

Thus, using simple tests using a test mask and a test resin, is of the same nature as the resin 20 which will be used with the optimised mask, a key parameter can be obtained for sizing this optimised mask.

Method for Developing an Abacus Linking Opaque Zone Density and Thickness Exposed to Light not Requiring any Test Mask The paragraphs below present a second method by which it is possible to obtain an abacus linking opaque zone density and thickness exposed to light in the resin (or height of the resin after development). This method is favoured, when no lithography mask is disposed being able to be used to carry out tests in view of sizing the optimised mask, thanks to the method according to the invention. It is understood that any other method can be implemented to obtain the same data.

The different steps of this method are illustrated in FIGS. 8A to 8F.

Figure 8A:
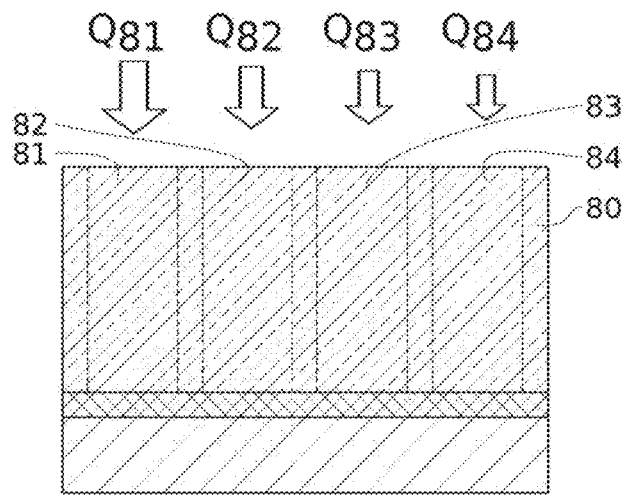
FIGS. 8A to 8F illustrate a sequence of steps making it possible to establish a contrast curve between the height of the resin after development and the opaque zone density, without test mask.
Figure 8B:
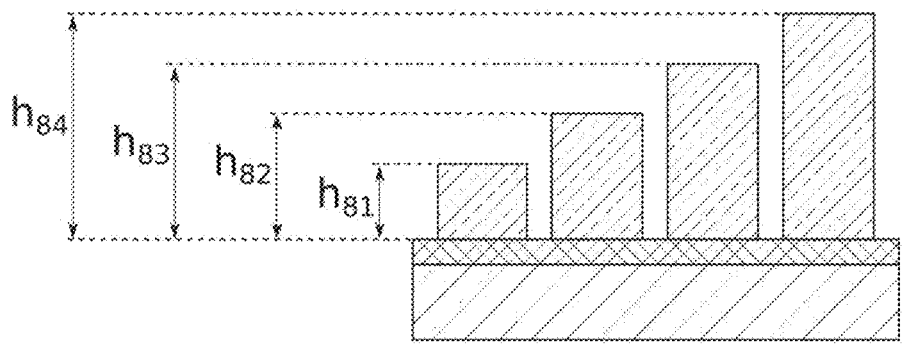

FIG. 8A illustrates the provision of a stack comprising a secondary resin layer 80 of the same nature as that which will be used in association with the optimised mask (resin layer 20). The secondary resin layer 80 is exposed from its upper face to a light-exposing radiation. Different zones 81, 82, 83, 84 of the resin 80 are exposed to light with different doses $Q_{81}$, $Q_{82}$, $Q_{83}$, $Q_{84}$, each inducing a certain thickness e of resin exposed to light. Due to this, after development (FIG. 8B) of the exposed resin, the secondary resin layer 80 has different heights $h_{81}$, $h_{82}$, $h_{82}$, $h_{83}$, at the different zones 81, 82, 83, 84. A resin height obtained after development can thus be associated with each dose.

Figure 8C:
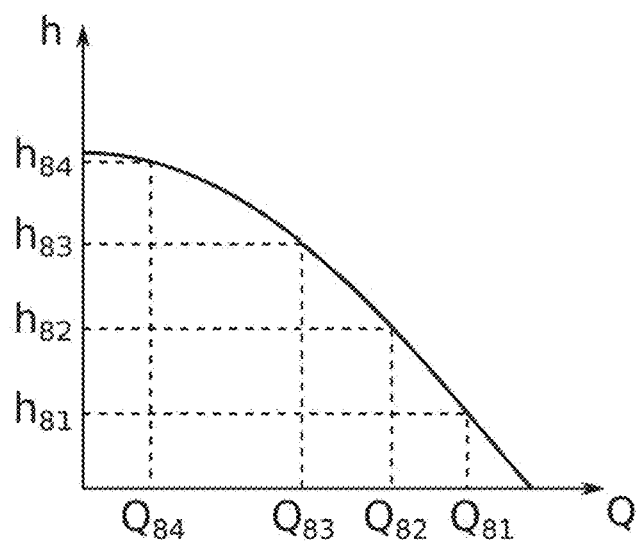

A trend curve can then be established, from the experimental points thus obtained, linking the dose applied to the resin and the height of the resin after development (FIG. 8C).

It is moreover possible to determine, for each zone i of the resin 80, the theoretical opaque zone density $D_i$ at a theoretical mask which would have made it possible to expose the zone in question to light, during its exposure to light through the theoretical mask, with a dose $Q_i$ that it has actually received during the calibration step illustrated in FIG. 8A. The following formula makes it possible to calculate this density $D_i$, $Q_i$ corresponding to the dose of radiation received by the zone i during the calibration step (FIG. 8A), and $Q_{max}$ corresponding to the dose of radiation having been received by the zone of the secondary resin 80 having been the most exposed to light (in the example illustrated in FIG. 8A, $Q_{max}=Q_{81}$):

[Math 10]

$$D_i = 1 - \frac{Q_i}{Q_{max}}$$

Therefore, the hypothesis is made, that for $Q_i=Q_{max}$, the opaque zone density at the theoretical mask is zero. This returns to considering that during the use of this theoretical mask, at equal exposure time $t_{expo}$, the intensity $I_0$ of the radiation before its passage through the mask corresponds to the intensity $I_{max}$ making it possible to obtain the dose $Q_{max}$ (i.e. $I_0=I_{max}$ with $I_{max}=Q_{max}/t_{expo}$).

Figure 8D:
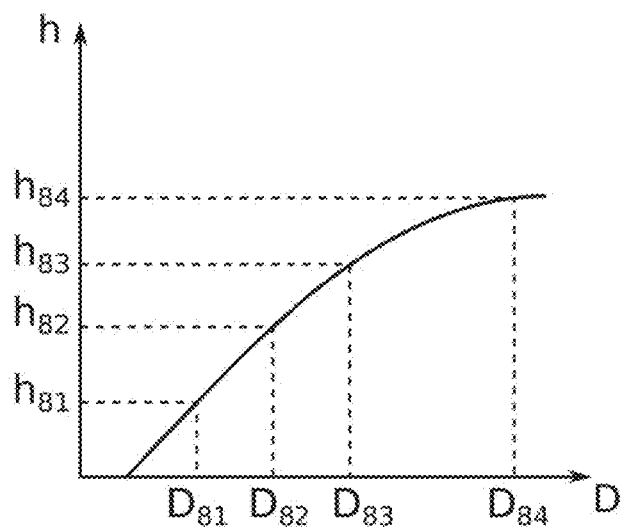
Figure 8E:
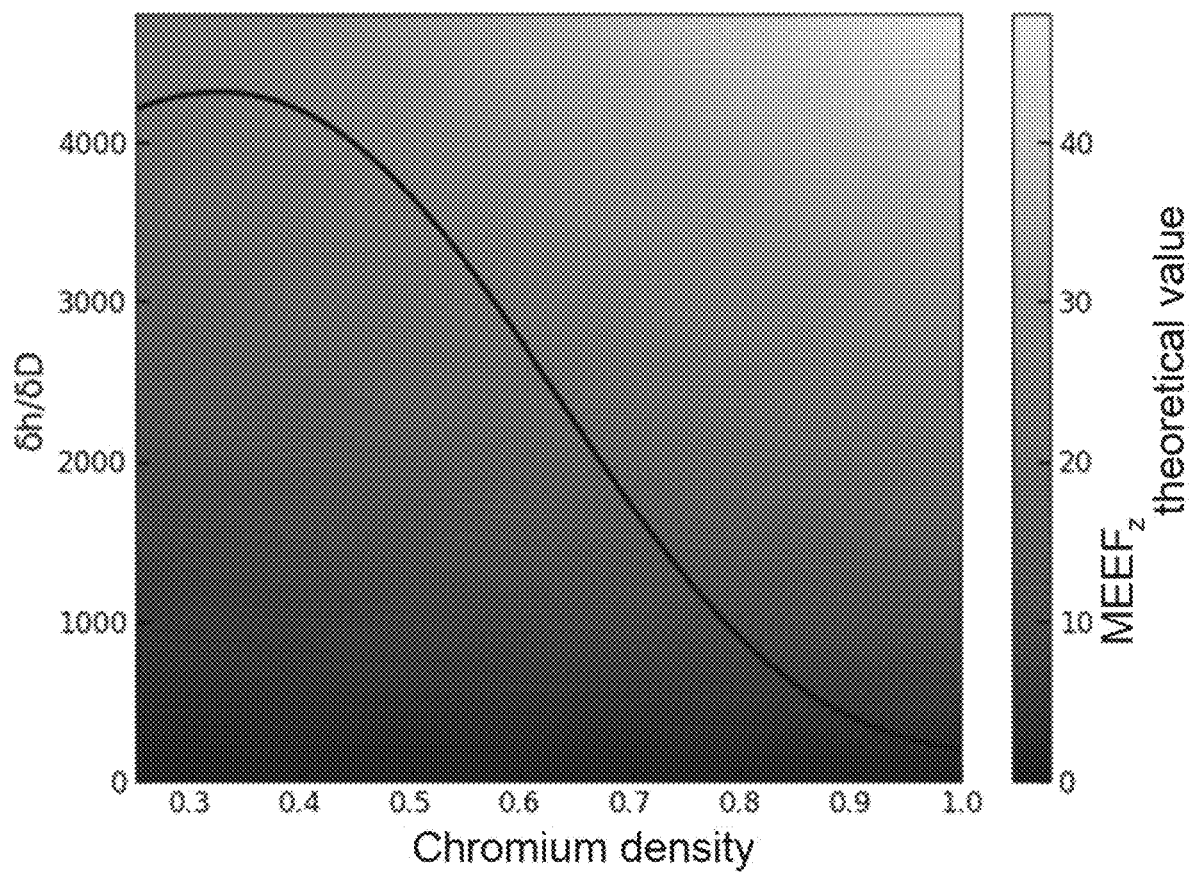
Figure 8F:
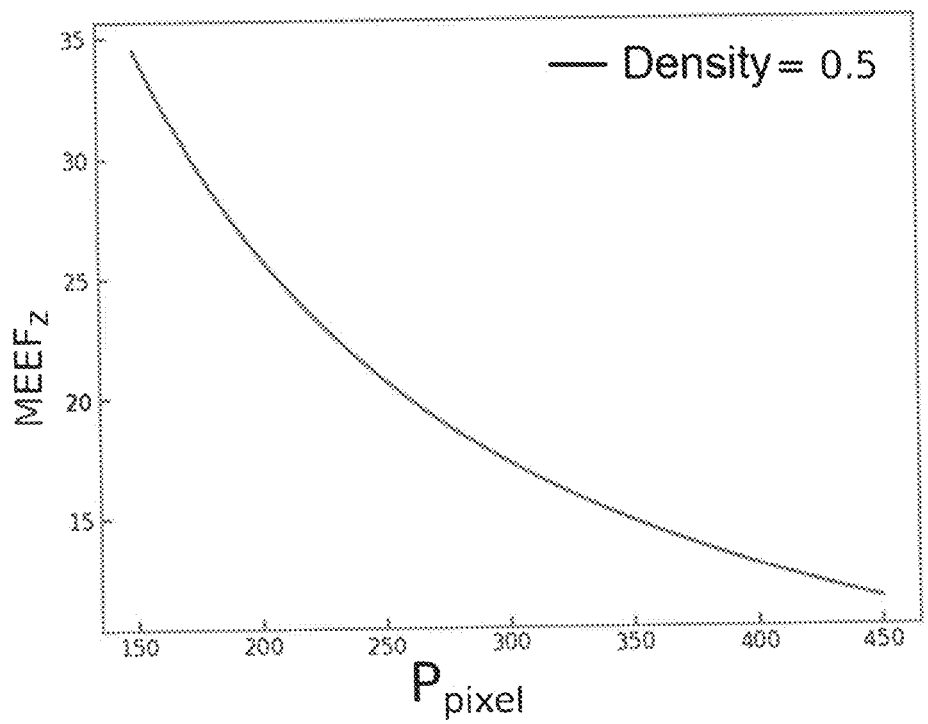

Thanks to the formula above and to the experimental points obtained by calibration, a trend curve can be established, connecting the opaque zone density D at the theoretical mask and the resin height h after development when the resin has been exposed to light through this mask (FIG. 8D). This trend curve, which corresponds to a contrast curve, is continuous and makes it possible to estimate the relationship between h and D for values of doses (and therefore, theoretical densities) not tested during the calibration.

The derivative of the function corresponding to this trend curve conveys the impact of a variation of the opaque zone density over the height of the resin after development. This value comes into play in determining the error over the height of the resin after development (see Math 7 formula).

Thus, using a simple calibration on a secondary resin 80 of the same nature as the resin 20 which will be used with the optimised mask, a key parameter can be obtained for sizing this optimised mask.

First Example of Implementation of the Sizing Method According to the Invention

Figure 7A:
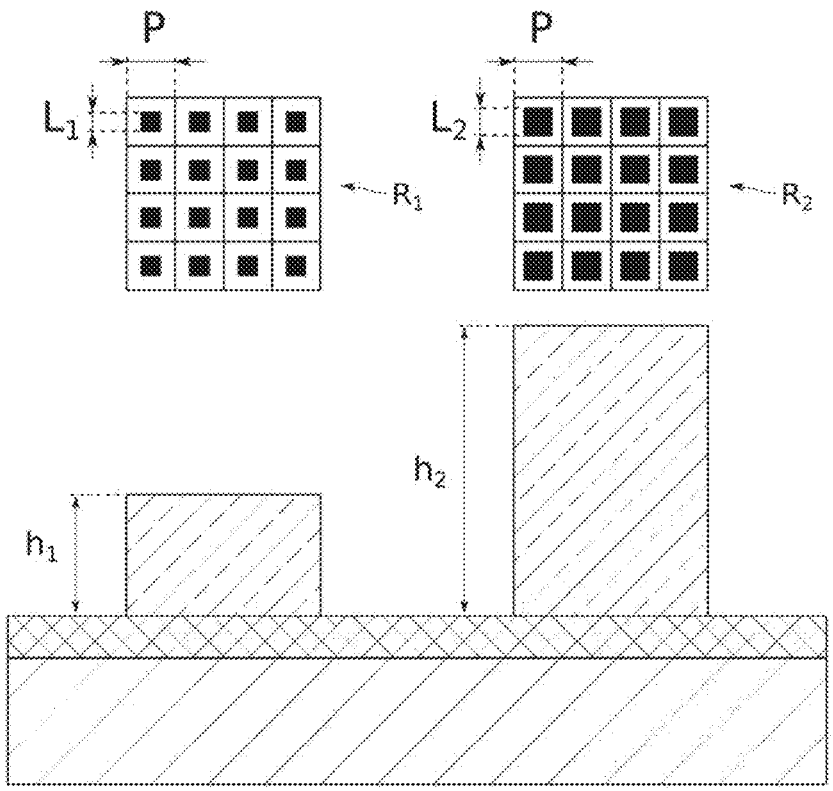
FIGS. 7A and 7B illustrate the resizing of a mask according to the method, according to the invention.
Figure 7B:
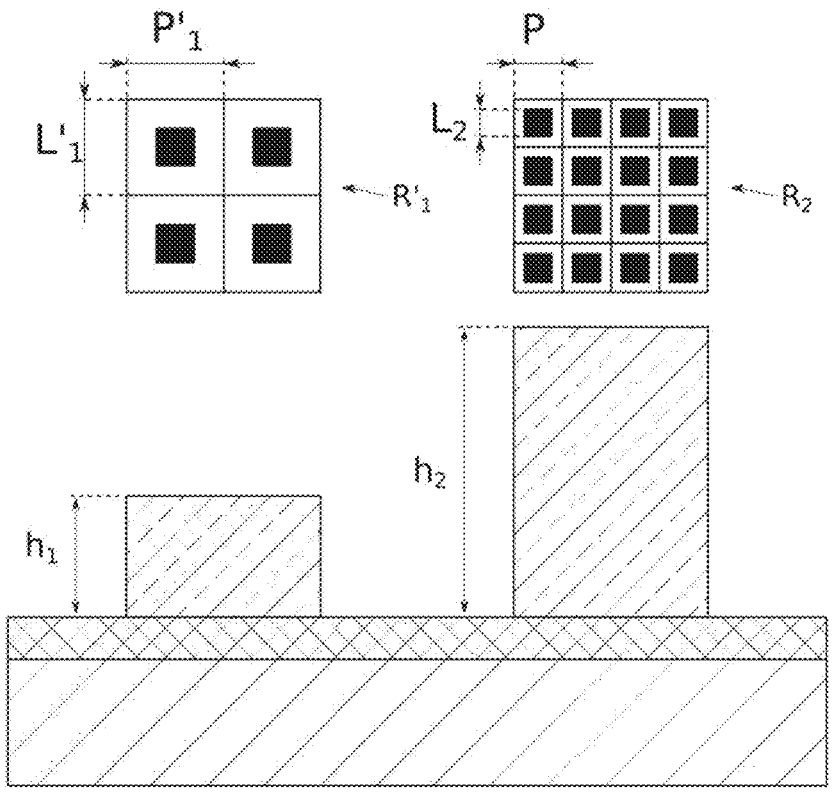

FIGS. 7A and 7B illustrate the way in which the method according to the invention can be used to resize a greyscale lithography mask having an unsatisfactory Z resolution.

FIG. 7A illustrates two gratings $R_1$, $R_2$ of one same mask 1 (or optionally two distinct masks 1) used to expose a resin layer to light over two distinct thicknesses, and therefore form in the resin layer, once this is developed, two distinct regions of heights $h_1$ and $h_2$. The heights $h_1$ and $h_2$ are obtained by sizing the masks, such that they have the suitable surface density of opaque zones. In FIG. 7A, the dimensions of the pixels and of the opaque zones have been chosen arbitrarily, with the sole constraint of the necessity that the surface density of opaque zones makes it possible to obtain the desired resin height. The two gratings have square pixels of side P. The grating $R_1$ giving a resin height $h_1$ has square opaque zones of side $L_1$, while the grating $R_2$ giving a resin height $h_2$ has square opaque zones of side $L_2$.

The method according to the invention makes it possible to determine what the ideal dimensions of the two gratings $R_1$, $R_2$ are, to limit the error over the resin heights $h_1$, $h_2$. According to the results of the method, relating to the grating $R_1$, it is necessary, to reach the desired accuracy levels, to assign a side $P_1'$ to the pixels, with $P_1'>P$ and to assign a side $L_1'$ to the opaque zones, with $L_1'>L_1$. Naturally, such that the height $h_1$ is the same before and after sizing, $L_1^2/P^2=L_1'^2/P_1'^2$ is had. By writing $L_1'=\alpha L_1$ and $P_1'=\alpha P_1$, a scale factor $\alpha$ can be established.

Concerning the grating $R_2$, it is found, by application of the method according to the invention, that the dimensions P and $L_2$ lead to a satisfactory error along z. These dimensions can therefore be preserved for sizing the optimised mask 1.

Thus, the passage from FIG. 7A to FIG. 7B illustrates a resizing of the mask 1 making it possible to obtain the same 3D structures at the photosensitive resin, but by guaranteeing a lower error in the vertical direction Z.

Figure 9A:
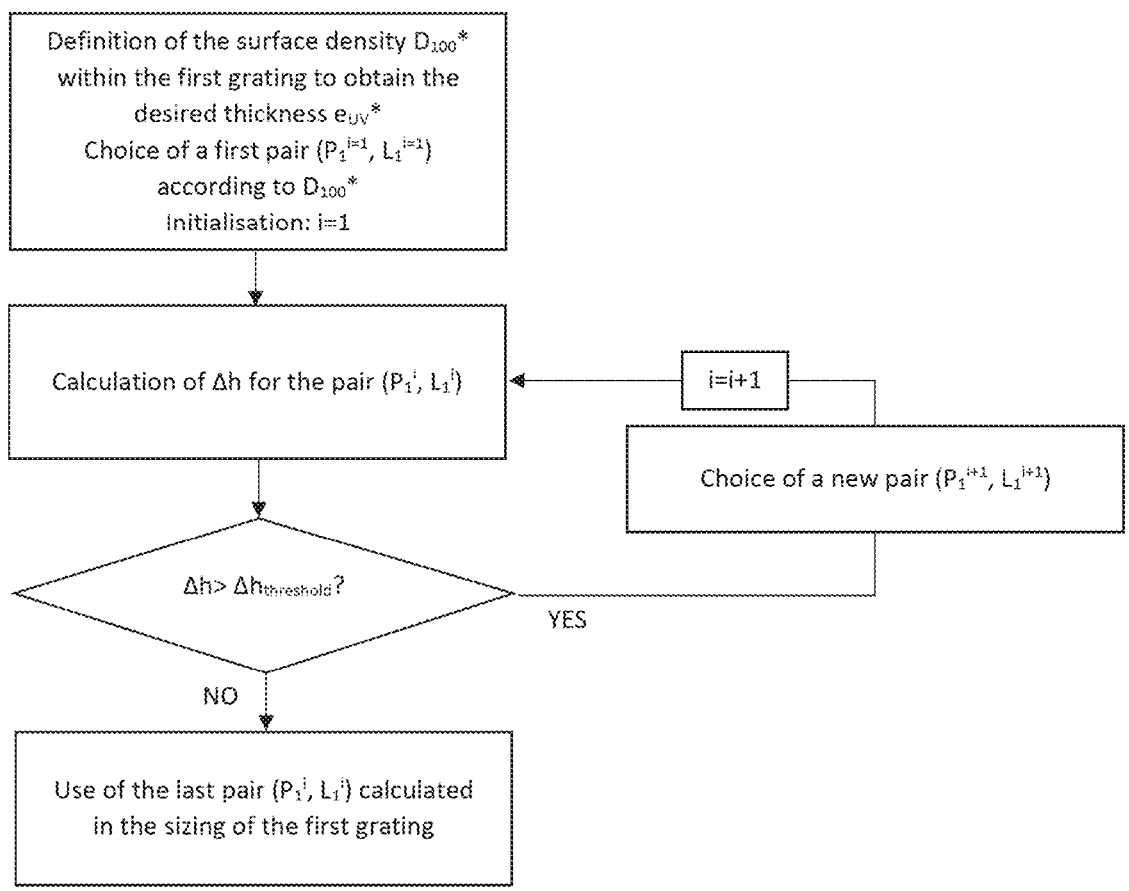
FIG. 9A is a flowchart having a sequence of steps enabling the implementation of the method according to the invention for a pixel grating.

Second Example of Implementation of the Sizing Method According to the Invention The following paragraphs describe, in reference to the flowchart presented in FIG. 9A, a sequence of steps enabling the sizing of the first grating 100 of the mask 1. These sequences are described for the first square-shaped pixels 110 and first square-shaped opaque zones 120, but it is understood that it can be adapted to any other shape of first pixels 110 and of first opaque zones 120.

a. Block 1001: In this step, the first target density $D_{100}*$ making it possible to expose the photosensitive resin to light over the first target thickness e* is defined. Then, a first pair of values $(P_1^{i=1}, L_1^{i=1})$ is chosen for the side $P_1$ of the first pixels 110 and for the side $L_1$ of the opaque zones 120. A counter i noting the pairs of values is initialised (i=1).

b. Block 1002: The error $\Delta h$ is calculated over the first target thickness e* for the pair $(P_1^i, L_1^i)$.

c. Block 1003: The error $\Delta h$ obtained in the preceding step is compared with respect to an error threshold $\Delta h_{threshold}$ fixed beforehand. If the error obtained is greater than this threshold, the step described in block 1004 is passed to. Otherwise, the step described in block 1005 is passed to.

d. Block 1004: The error over the first target thickness e* for the pair $(P_1^i, L_1^i)$ not being satisfactory, a new pair of values $(P_1^{i+1}, L_1^{i+1})$ is chosen for the side $P_1$ of the first pixels 110 and for the side $L_1$ of the opaque zones 120, with $P_1^{i+1}>P_1^i$ and by respecting $(L_1^i)^2/(P_1^i)^2 = (L_1^{i+1})^2/(P_1^{i+1})^2$ to preserve the same opaque zone density 120. Then, block 1002 is passed to. Upon each passage from block 1004 to block 1002, i is incremented by 1.

e. Block 1005: The error over the first target thickness e* for the pair which has formed the subject of the last calculation in block 1002 is satisfactory. This pair can therefore be preserved for the sizing of the first grating 100 of the mask 1.

Third Example of Implementation of the Sizing Method According to the Invention

Figure 9B:
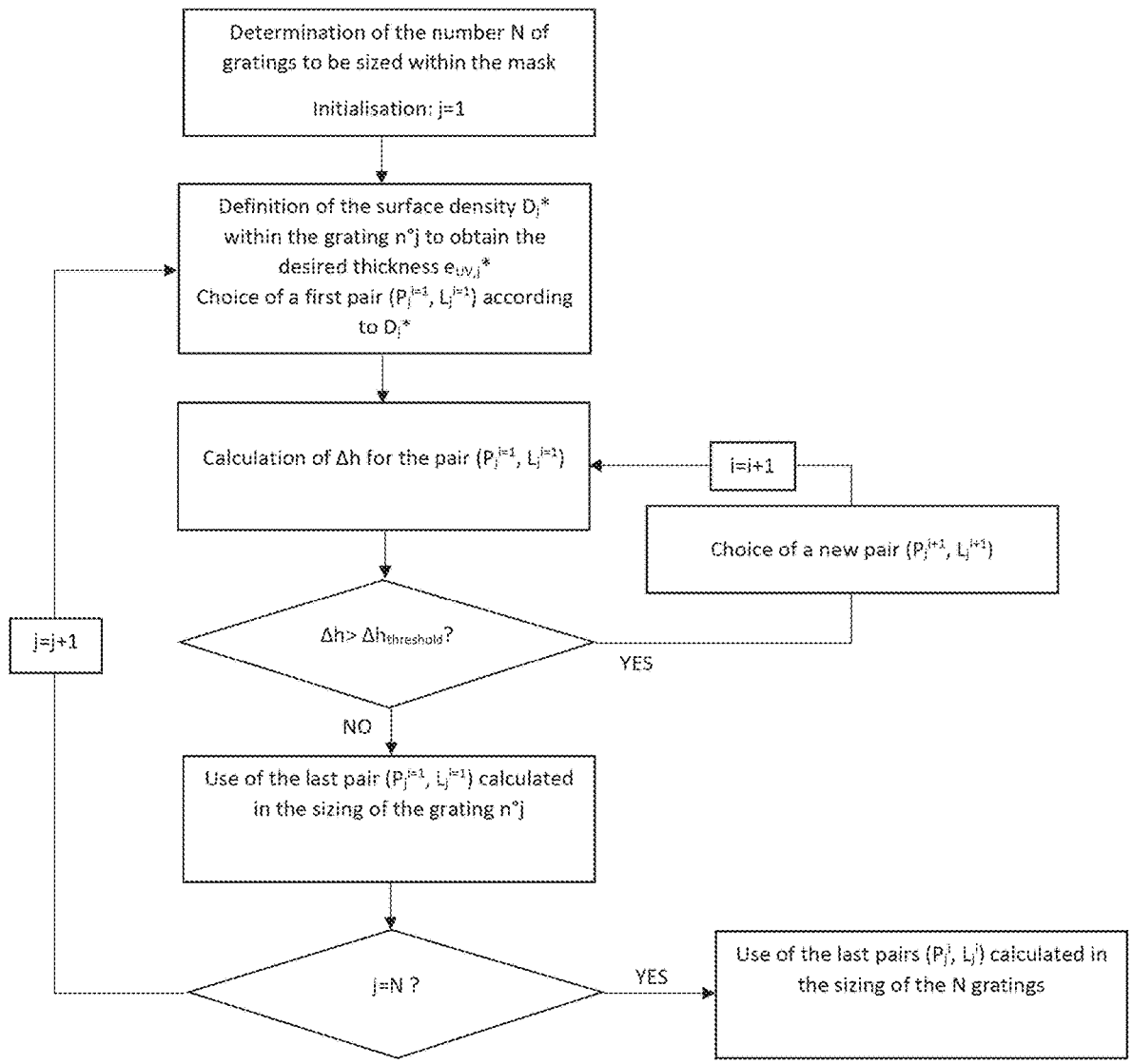
FIG. 9B is a flowchart having a sequence of steps enabling the implementation of the method according to the invention for a plurality of pixel gratings.

The following paragraphs describe, in reference to the flowchart presented in FIG. 9B, a sequence of steps enabling the sizing of the mask 1 when this comprises N gratings. These sequences are described for square-shaped pixels and square-shaped opaque zones, but it is understood that they can be adapted to any other shape of pixels and opaque zones.

a. Block 2001: In this first step, the number N of gratings to be sized within the mask is determined. A counter j noting these N gratings is initialised (j=1).

b. Block 2002: In this step, the target density $D_j*$ of the grating n°j making it possible to expose the photosensitive resin to light over the target thickness $e_j*$ is defined. Then, a first pair of values $(P_j^{i=1}, L_j^{i=1})$ is chosen for the side $P_j$ of the pixels of the grating n°j and for the side $L_j$ of the opaque zones of the grating n°j.

c. Block 2003: Then, the error $\Delta h$ is calculated over the target thickness $e_j*$ for the pair $(P_j^i, L_j^i)$.

d. Block 2004: The error $\Delta h$ obtained in the preceding step is compared with respect to an error threshold $\Delta h_{threshold}$ fixed beforehand. If the error obtained is greater than this threshold, the step described in block 2005 is passed to. Otherwise, the step described in block 2006 is passed to.

e. Block 2005: The error over the first target thickness $e_j^*$ for the pair $(P_1^i, L_1^i)$ not being satisfactory, a new pair of values $(P_1^{i+1}, L_1^{i+1})$ is chosen for the side $P_j$ of the pixels of the grating n° j and for the side $L_j$ of the opaque zones of the grating n°j, with $P_j^{i+1} > P_j^i$ and by respecting $(L_j^i)^2/(P_j^i)^2 = (L_j^{i+1})^2/(P_j^{i+1})^2$ to preserve the same opaque zone density within the grating n°j. Then, block 2003 is passed to. Upon each passage from block 2005 to block 2003, i is incremented by 1.

f. Block 2006: The error over the first target thickness $e_j^*$ for the pair which has formed the subject of the last calculation in block 2003 is satisfactory. This pair can therefore be preserved for the sizing of the grating n°j of the mask 1.

g. Block 2007: It is verified if j=N. If this is not the case, j is incremented by 1, and block 2002 is returned to. If this is the case, block 2008 is passed to.

h. Block 2008: The N gratings have been sized. The mask in its entirety can be sized.

The invention is not limited to the embodiments described above, and extends to all the embodiments covered by the invention. In particular, the implementation of the method according to the invention is not limited to the manufacture of microlenses and can naturally enable the manufacture of 3D structures, as diverse as pillars, cones, slanted gratings and staircase structures.

The invention claimed is:

1. A method for sizing a greyscale lithography mask, the mask mainly extending along a horizontal plane defined by a first direction and a second direction, the plane being perpendicular to a main direction of a light-exposing radiation of a photosensitive resin through the mask, the mask comprising a plurality of opaque zones to the radiation, each opaque zone being located in a zone of the mask called pixel, the plurality of opaque zones comprising first opaque zones being located in first pixels, the first pixels forming a first grating of the mask, the method comprising the following steps:

establishing a first target density $D_{100}^*$ of a first surface density $D_{100}$ of first opaque zones within the first grating, the first target density $D_{100}^*$ being configured to enable the resin to be exposed to light over a first given target thickness $e_1^*$ when the resin is exposed to radiation through the first mask grating, the first target thickness $e_1^*$ being measured in the main direction of the radiation, obtaining a first value, for the first target density $D_{100}^*$, of the derivative with respect to the first surface density $D_{100}$ of a first thickness $e_1$ over which the photosensitive resin is exposed to light, when it is exposed to a radiation through the first grating having the first surface density $D_{100}$, said first value being referenced $$\frac{\partial e_1(D_{100}^*)}{\partial D_{100}},$$

determining a first dimension $P_{x,1}$ of the first pixels in the first direction, a first dimension $P_{y,1}$ of the first pixels in the second direction, a first dimension $L_{x,1}$ of the first opaque zones in the first direction, a first dimension $L_{y,1}$ of the first opaque zones in the second direction, such that the value of an error over the first target thickness $e_1^*$, referenced $MEEF(e_1^*)$, is less than a first given threshold, $MEEF(e_1^*)$ being calculated from the following formula:

$$MEEF(e_1^*) = \frac{\partial e_1(D_{100}^*)}{\partial D_{100}} \frac{(a_1 + \beta_1)L_{x,1}}{P_{x,1}P_{y,1}}$$

with $$\beta_1 = \frac{L_{y,1}}{L_{x,1}} \text{ and } a_1 = \frac{\delta L_{y,1}}{\delta L_{x,1}}, \delta L_{x,1}$$

being an error over $L_{x,1}$ and $\delta L_{y,1}$ being an error over $L_{y,1}$, using the dimensions obtained for the sizing of the first mask grating.

2. The method according to claim 1, wherein $a_1$ is between 0.8 and 1.2, preferably a is equal to 1.

3. The method according to claim 1, wherein the step of obtaining the first value of the derivative comprises the following steps:

providing a secondary resin of the same nature as the photosensitive resin, exposing a plurality of regions of the secondary resin to light with a radiation, each region being exposed to light with a distinct dose of radiation, for each region of the secondary resin, determining in the main direction of the radiation, a light-exposing thickness of the radiation in said region, establishing, for each region of the secondary resin, a theoretical density of theoretical opaque zones on a theoretical mask, which, during exposure to a radiation of said region through the theoretical mask, would have made it possible to expose said region to the dose of radiation, to which said region is exposed, establishing a model connecting the light-exposing thickness of the secondary resin layer to the opaque zone density from light-exposing thickness and theoretical density data obtained for each of the regions.

4. The method according to claim 3, wherein the step of establishing, for each region of the secondary resin, of the theoretical density of theoretical opaque zones, is done at least by application of the following formula:

$$D_i = 1 - \frac{Q_i}{Q_{max}}$$

with i indexing the different regions of the secondary resin, $D_i$ the theoretical density associated with the region i, $Q_i$ the dose of radiation to which the region i is exposed and $Q_{max} = \max(Q_i)$.

5. The method according to claim 1, wherein the step of obtaining the first value of the derivative comprises the following steps:

providing a test mask having a plurality of test gratings, each having a distinct density of test opaque zones, providing a test resin of the same nature as the photosensitive resin, exposing a plurality of regions of the test resin to light with a radiation through the test mask, the exposing to light of each region being done through a distinct test grating, determining, for each region of the test resin, a light-exposing thickness of the radiation in said region, establishing a model connecting the light-exposing thickness of the test resin layer to the density of test opaque zones from light-exposing thickness data obtained for each of the regions.

6. The method according to claim 1, wherein the first dimension $P_{x,1}$ of the first pixels in the first direction and the first dimension $P_{y,1}$ of the first pixels in the second direction are each less than a main wavelength of the radiation.

7. The method according to claim 1, wherein the first pixels have a square shape in the horizontal plane and wherein $P_{x,1}=P_{y,1}=P$.

8. The method according to claim 7, wherein the first opaque zones have a square shape in the horizontal plane and wherein $L_{x,1}=L_{y,1}=L$.

9. The method according to claim 7, wherein:

the first opaque zones have a square shape in the horizontal plane and wherein $L_{x,1}=L_{y,1}=L$, and $$MEEF(e_1^*) = \frac{\partial e_1(D_{100}^*)}{\partial D_{100}} \frac{2\sqrt{D_{100}^*}}{P}.$$

10. The method according to claim 1, wherein the plurality of opaque zones comprises at least second opaque zones being located in second pixels, the second pixels forming a second mask grating, the method further comprising the following steps:

establishing a second target density $D_{200}^*$ of a second surface density $D_{200}$ of second opaque zones within the second grating, the second target density $D_{200}^*$ being configured to enable the resin to be exposed to light over a second given target thickness $e_2^*$ when the resin is exposed to the radiation through the second mask grating, the second target thickness $e_2^*$ being measured in the main direction of the radiation, the second target thickness $e_2^*$ being distinct from the first target thickness $e_1^*$, obtaining a second value, for the second target density $D_{200}^*$, of the derivative with respect to the second surface density $D_{200}$ of a second thickness $e_2$ over which the photosensitive resin is exposed to light when it is exposed to a radiation through the second grating having the second surface density $D_{200}$, referenced $$\frac{\partial e_2(D_{200}^*)}{\partial D_{200}},$$

determining a second dimension $P_{x,2}$ of the second pixels in the first direction, a second dimension $P_{y,2}$ of the second pixels in the second direction, a second dimension $L_{x,2}$ of the second opaque zones in the first direction, a second dimension $L_{y,2}$ of the second opaque zones in the second direction, such that the value of an error over the second target thickness $e_2^*$, referenced MEEF($e_2^*$) is less than a second given threshold, MEEF($e_2^*$) being calculated from the following formula:

$$MEEF(e_2^*) = \frac{\partial e_2(D_{200}^*)}{\partial D_{200}} \frac{(a_2 + \beta_2)L_{x,2}}{P_{x,2}P_{y,2}}.$$

$$\beta_2 = \frac{L_{y,2}}{L_{x,2}} \text{ and } a_2 = \frac{\delta L_{y,2}}{\delta L_{x,2}}, \delta L_{x,2}$$

with being an error over $L_{x,2}$ and $\delta L_{y,2}$ being an error over $L_{y,2}$, using the dimensions obtained for the sizing of the second mask grating.

11. The method according to claim 10, wherein the second grating forms, in the horizontal plane, a closed contour, wherein the first grating is located.

12. The method according to claim 11, wherein the closed contour formed by the second grating is substantially circular.

13. The method according to claim 11, wherein the second threshold for the error over the second target thickness $e_2^*$ is less than the first threshold for the error over the first target thickness $e_1^*$.

14. The method for manufacturing a greyscale lithography mask comprising the following steps:

sizing the mask by implementation of the method according to claim 1, manufacturing the mask thus sized.

\* \* \* \* \*